(12) United States Patent
Lin et al.

(10) Patent No.: US 7,643,330 B1
(45) Date of Patent: Jan. 5, 2010

(54) SEQUENTIALLY-ACCESSED 1R/1W DOUBLE-PUMPED SINGLE PORT SRAM WITH SHARED DECODER ARCHITECTURE

(75) Inventors: Hwong-Kwo Lin, Palo Alto, CA (US); Ge Yang, Pleasanton, CA (US); Ethan A. Frazier, Sunnyvale, CA (US); Charles Chew-Yuen Young, Cupertino, CA (US)

(73) Assignee: NVIDIA Corporation, San Jose, CA (US)

(*) Notice: Subject to any disclaimer, the term of this patent is extended or adjusted under 35 U.S.C. 154(b) by 247 days.

(21) Appl. No.: 11/838,785

(22) Filed: Aug. 14, 2007

(51) Int. Cl.
*G11C 11/00* (2006.01)
(52) U.S. Cl. .................. 365/154; 365/189.04
(58) Field of Classification Search ................ 365/154, 365/189.04, 230.05; 711/149, 5, 147
See application file for complete search history.

(56) References Cited

U.S. PATENT DOCUMENTS

| | | | |
|---|---|---|---|
| 4,843,264 A | 6/1989 | Galbraith | |
| 4,878,198 A | 10/1989 | Roy | |
| 5,018,106 A | 5/1991 | Ul Haq et al. | |
| 5,781,480 A * | 7/1998 | Nogle et al. | 365/189.04 |
| 6,269,036 B1 * | 7/2001 | Shubat | 365/201 |
| 6,335,873 B1 | 1/2002 | Kawaguchi et al. | |
| 6,563,730 B1 | 5/2003 | Poplevine et al. | |
| 6,882,562 B2 * | 4/2005 | Beucler | 365/154 |
| 6,885,231 B2 | 4/2005 | Kuppuswamy et al. | |
| 7,119,596 B2 | 10/2006 | Kong et al. | |
| 7,349,285 B2 * | 3/2008 | Balasubramanian et al. | 365/230.05 |
| 7,529,139 B2 * | 5/2009 | Huang et al. | 365/189.02 |
| 2006/0176729 A1 | 8/2006 | Chan et al. | |

OTHER PUBLICATIONS

Office Action. U.S. Appl. No. 11/838,818 dated Apr. 3, 2009.

* cited by examiner

*Primary Examiner*—Vu A Le
(74) *Attorney, Agent, or Firm*—Patterson & Sheridan, LLP

(57) ABSTRACT

One embodiment of the present invention sets forth a synchronous two-port static random access memory (SRAM) design with the area efficiency of a one-port SRAM. By restricting both access ports to an edge-triggered, synchronous clocking regime, the internal timing of the SRAM can be optimized to allow high-performance double-pumped access to the SRAM storage cells. By double-pumping the SRAM storage cells, one read access and one write access are possible per clock cycle, allowing the SRAM to present two external ports, each capable of performing one transaction per clock cycle.

20 Claims, 9 Drawing Sheets

SEQUENTIALLY-ACCESSED 1R/1W DOUBLE-PUMPED SINGLE PORT SRAM WITH SHARED DECODER ARCHITECTURE

BACKGROUND OF THE INVENTION

1. Field of the Invention

Embodiments of the present invention relate generally to static random access memory (SRAM) design and more specifically to a sequentially-accessed 1R/1W double-pumped single port SRAM with a shared decoder architecture.

2. Description of the Related Art

Integrated circuits commonly embed SRAM circuits to provide on-chip data storage. A given instance of an SRAM circuit is typically configured to meet specific design requirements associated with the surrounding circuitry attached to the SRAM. One common type of SRAM circuit provides one port for either read or write access to data stored within the SRAM. The address inputs to such a circuit are typically shared for both read and write access. Another common type of SRAM circuit, referred to as a two-port SRAM, provides two ports for accessing data stored within the SRAM. Two-port SRAM circuits usually restrict all read accesses to one port and all write accesses to the second port. Each port of a two-port SRAM is typically capable of asynchronous, independent access to data stored within the SRAM, allowing the two-port SRAM to be incorporated in a range of different applications with different usage models.

The two-port SRAM allows designers to achieve system performance levels that are generally higher than those possible using only one-port SRAM circuits. However, for a given number of storage bits, existing two-port SRAM circuits require approximately double the area of one-port SRAM circuits. Thus, integrated circuits where instances of SRAM circuits are a significant portion of the overall die area, using two-port SRAM circuits can be an extremely expensive design option.

One way to reduce the die area expense associated with using two-port SRAM circuits involves substituting each two-port SRAM circuit with a one-port SRAM circuit that operates at twice the access clock speed. By doubling the access clock speed, adequate read and write bandwidth may be provided. However, this solution involves generating an additional clock reference that is exactly twice the original clock frequency and generally requires substantial additional power. Furthermore, in high-performance designs, operating an SRAM at twice an already aggressive clock frequency may not be possible.

As the foregoing illustrates, what is needed in the art is a high-performance, area efficient two-port SRAM circuit design.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
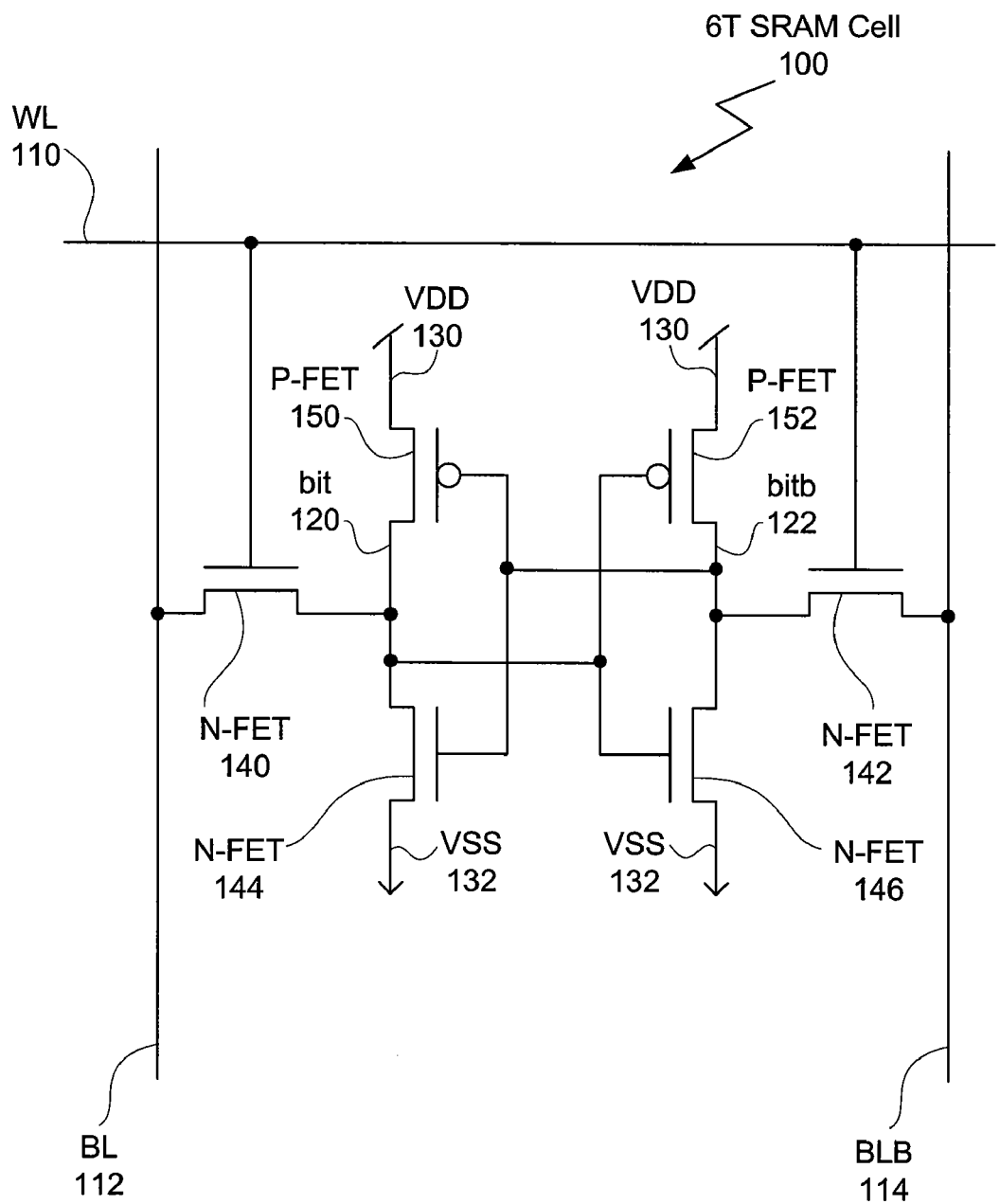
FIG. 1 illustrates the circuit design of a six-transistor (6T) static random access memory (SRAM) cell, according to one embodiment of the invention.

FIG. 1 illustrates the circuit design of a six-transistor (6T) static random access memory (SRAM) cell 100, according to one embodiment of the invention. The 6T SRAM cell 100 includes two p-channel field effect transistors (P-FETs) 150, 152, four n-channel field effect transistors (N-FETs) 140, 142, 144 and 146. The 6T SRAM cell is connected to a word line (WL) 110, a bit line (BL) 112, and a bit line bar (BLB) 114.

P-FET 150 and N-FET 144 form a first logic inverter, with output bit 120. P-FET 152 and N-FET 146 form a second logic inverter, with output bitb 122. P-FETs 150 and 152 are connected to a positive supply voltage, conventionally called "VDD" 130 in complimentary symmetry metal-oxide semiconductor (CMOS) circuits. N-FETs 144 and 146 are connected to the zero-voltage reference node (or "ground"), conventionally called "VSS" 132 in CMOS circuits. The output of the first logic inverter, bit 120, is connected to the input of the second logic inverter, formed by the gate nodes of P-FET 152 and N-FET 146. The output of the second logic inverter, bitb 122, is connected to the input of the second logic inverter, formed by the gate nodes of P-FET 150 and N-FET 144. This configuration of the two inverters forms a one bit storage cell, including a two-stage high-gain feedback loop that provides stable storage of data. The one bit of data is represented in a positive sense on bit 120 and in a negative sense (inverted) form on bitb 122.

Data stored on bit 120 may be accessed on BL 112 through N-FET 140, when N-FET 140 is switched on. Similarly, data stored on bitb 122 may be accessed on BLB 114 through N-FET 142, when N-FET 142 is switched on. Both N-FETs 140 and 142 are switched on when the voltage on WL 110 is in a high state (close to voltage VDD). Both N-FETs 140 and 142 are switched off when the voltage on WL 110 is in a low state (close to voltage VSS). Thus, WL 110 may be used to selectively access the data stored on bit 120 and bitb 122.

TData may be read from or written to the 6T SRAM cell 100. When data is read from the 6T SRAM cell 100, WL 110 is asserted, causing bit 120 to be coupled to BL 112 and bitb 122 to be coupled to BLB 114. The voltage difference between BL 112 and BLB 114 is positive when the 6T SRAM cell 100 is storing a "1" and negative when the 6T SRAM cell 100 is storing a "0." Differential voltage sensing is used on BL 112 and BLB 114 to improve the performance and reliability.

When data is written to the 6T SRAM cell 100, WL 110 is asserted to couple bit 120 to BL 112 and bitb 122 to BLB 114. However, rather than sensing the resulting voltages on BL 112 and BLB 114, these lines are instead driven with the value of the write data. BL 112 is driven with the positive sense version of the write data and BLB 114 is driven with the negative sense (inverted) of the write data. Persons skilled in the art will recognize that BL 112 and BLB 114 should be driven with enough current to overcome the stable feedback loop of the two inverters. Additionally, N-FET 140 and N-FET 142 should provide sufficient conductivity to enable the flow of enough current to overcome the two inverters.

Figure 2:
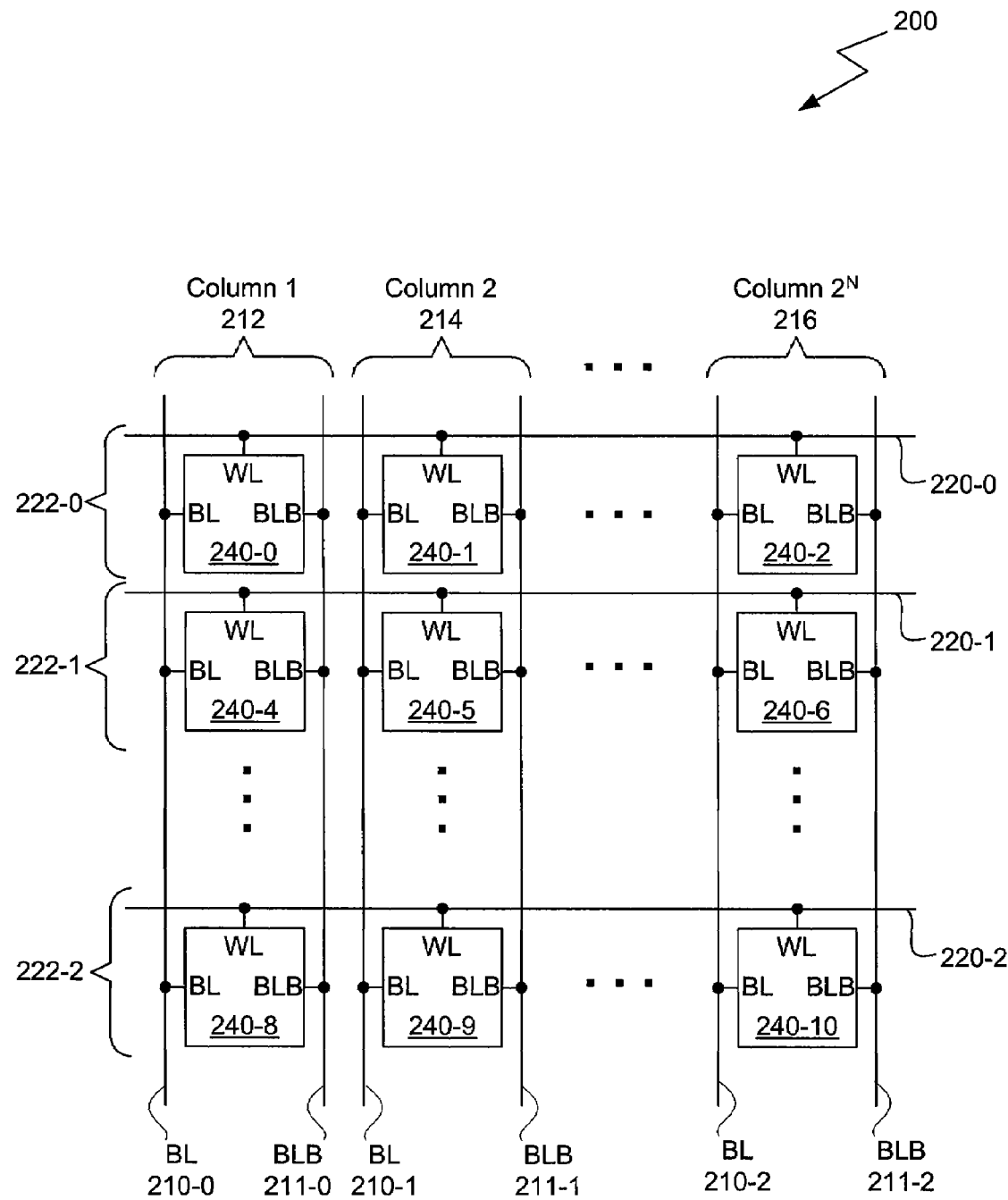
FIG. 2 depicts an array of 6T SRAM cells, according to one embodiment of the invention.

FIG. 2 depicts an array of 6T SRAM cells 200, according to one embodiment of the invention. The array of 6T SRAM cells 200 includes 6T SRAM cells 240, which are organized in a rectangular two-dimensional grid of rows and columns. The 6T SRAM cells 240 may be instances of the 6T SRAM cell 100 of FIG. 1. Word lines 220 run along the rows in the array. Each row 222 has a corresponding word line 220. For example, rows 222-0, 222-1 and 222-2 have corresponding to word lines 220-0, 220-1, 220-2, respectively. The word lines 220 connect to the WL ports of the 6T SRAM cells within the corresponding row. For example, word line 220-0 connects to each WL port of the 6T SRAM cells 240-0, 240-1 and 240-2 in row 222-0.

As shown, each column 212, 214, 216 has a corresponding pair of bit lines, called BL 210 and BLB 211. The bit lines, BL 210 and BLB 211, associated with each column connect to the BL and BLB ports of the 6T SRAM cells in the column. For example, column 212 has bit lines BL 210-0 and BLB 211-0, which connect to the BL and BLB ports of 6T SRAM cells 240-0 240-4 and 240-8.

The array of 6T SRAM cells 200 provides raw storage of data that is organized into rows, where each row (or "word") of data is selected for access using word lines 220 and each bit of data within the row is accessed using bit lines BL 210 and BLB 211. Circuitry to perform the actual read and write operations to the rows of data is discussed in FIGS. 3 to 8.

Figure 3:
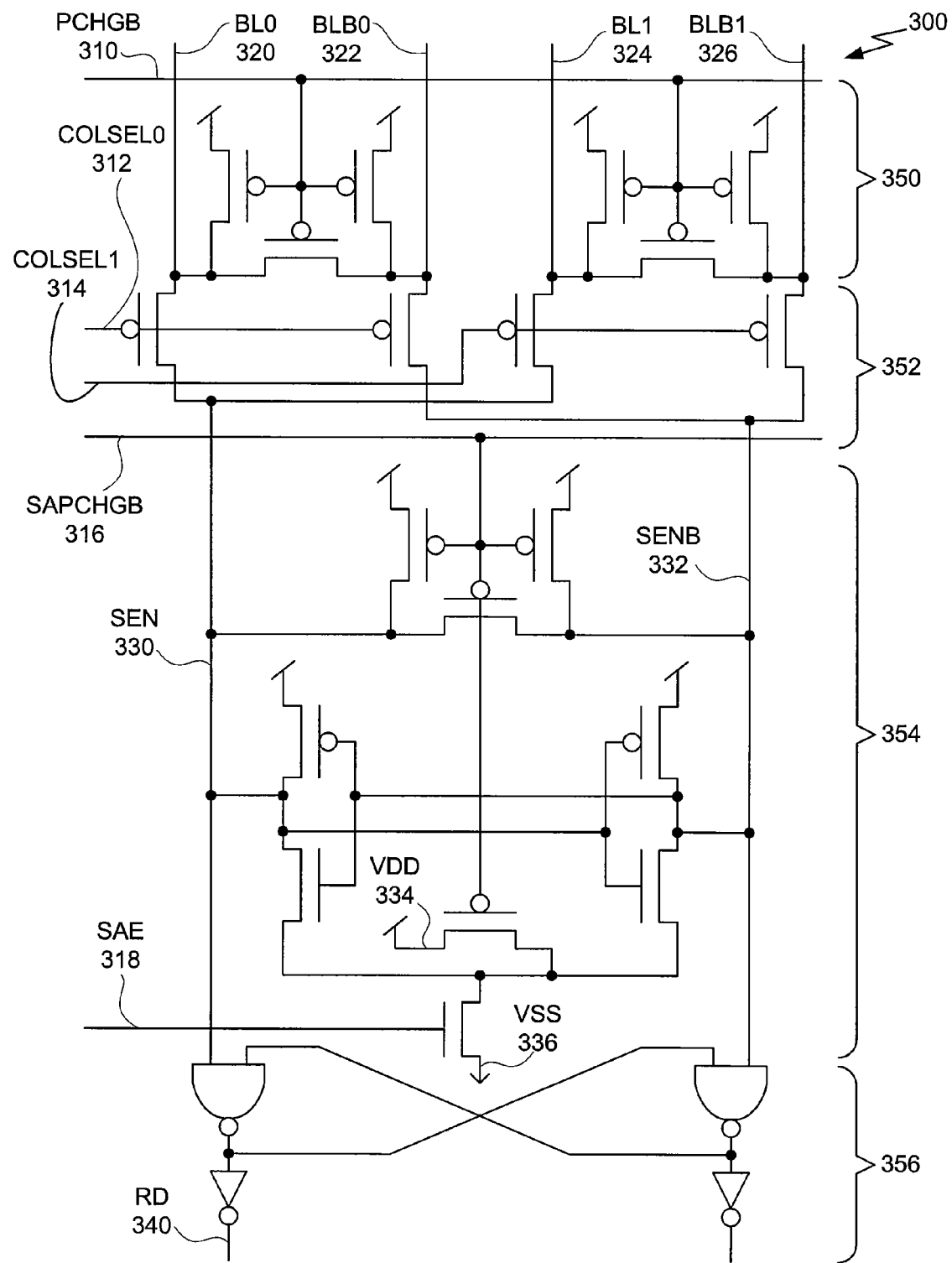
FIG. 3 illustrates the circuit design of a read path used to read data from the array of 6T SRAM cells, according to one embodiment of the invention.

FIG. 3 illustrates the circuit design of a read path 300 used to read data from the array of 6T SRAM cells, according to one embodiment of the invention. The read path 300 includes a pre-charge circuit 350, a read column multiplexer 352, a sense amplifier 354, and an output set-reset (SR) latch 356. Bit lines BL0 320, BLB0 322, BL1 324 and BLB1 326 are data inputs to the read path 300. Pre-charge bar (PCHGB) 310, column select 0 (COLSEL0) 312, column select 1 (COLSEL1) 314, sense amplifier pre-charge bar (SAPCHGB) 316 and sense amplifier enable (SAE) 318 are control inputs to the read path 300. Read data (RD) 340 is a buffered output used to transmit one bit of data read by the read path 300 to outside circuitry.

The pre-charge circuit 350 uses the PCHGB 310 signal to initiate a pre-charge of all of the associated bit lines BL0 320, BLB0 322, BL1 324 and BLB1 326. The pre-charge operation involves shorting each positive sense bit line to each corresponding negative sense bit line, while pulling both bit lines to a positive supply voltage, VDD 334, to prepare and stabilize the bit lines for a pending read operation. For example, when PCHGB 310 is in a low (active) state, BL0 320 is shorted to BLB0 322 while both BL0 320 and BLB0 322 are pulled to the positive supply voltage, VDD 334. Similarly, when PCHGB 310 is in a low (active) state, BL0 324 is shorted to BLB0 326 while both BL0 324 and BLB0 326 are pulled to the positive supply voltage, VDD 334.

The read column multiplexer 352 uses COLSEL0 and COLSEL1 to multiplex one of the bit line pairs BL0 320, BLB0 322 or BL1 324, BLB1 326 to the sense amplifier 354. When COLSEL0 is low (active), BL0 320 is coupled to SEN 330 and BLB0 322 is coupled to SENB 332. In this state, COLSEL1 should be high (inactive). Similarly, when COLSEL1 is low (active), BL1 324 is coupled to SEN 330 and BLB1 326 is coupled to SENB 332. In this state, COLSEL0 should be high (inactive).

The sense amplifier 354 uses the two control inputs SAPCHGB 316 and SAE 318 to activate portions of related circuitry. When the SAPCHGB 316 signal is active, the sense amplifier 354 performs a pre-charge operation on nodes SEN 330 and SENB 332. The pre-charge operation involves shorting SENB 330 and SENB 332 together, while pulling both to the positive supply voltage, VDD 334.

The sense amplifier 354 is enabled when SAE 318 is high (active), allowing a two inverter feedback loop differential amplifier structure internal to the sense amplifier 354 to be powered across VDD 334 and VSS 336. The sense amplifier 354 is disabled (SAE 318 set low) when not in use and enabled just prior to use. Disabling and re-enabling the sense amplifier 354 serves the purpose of resetting the state of the two inverter feedback loop differential amplifier before each sensing event.

The output SR latch 356 is built from two cross-coupled nand gates with buffered outputs. When the sense amplifier 354 is disabled, SEN 330 and SENB 332 may float to VDD and the output SR latch 356 holds the output state on RD 340. When the sense amplifier 354 is pre-charged (SAPCHGB 316 is active), SEN 330 and SENB 332 are pulled to VDD and output SR latch 356 continues to hold the output state on RD 340. When the sense amplifier 354 senses a value, either SEN 330 or SENB 332 is pulled completely low by the sense amplifier 354. Pulling either SEN 330 or SENB 332 low causes the output SR latch 356 to change (or hold) state accordingly, thereby reflecting the value of the selected bit lines.

Figure 4:
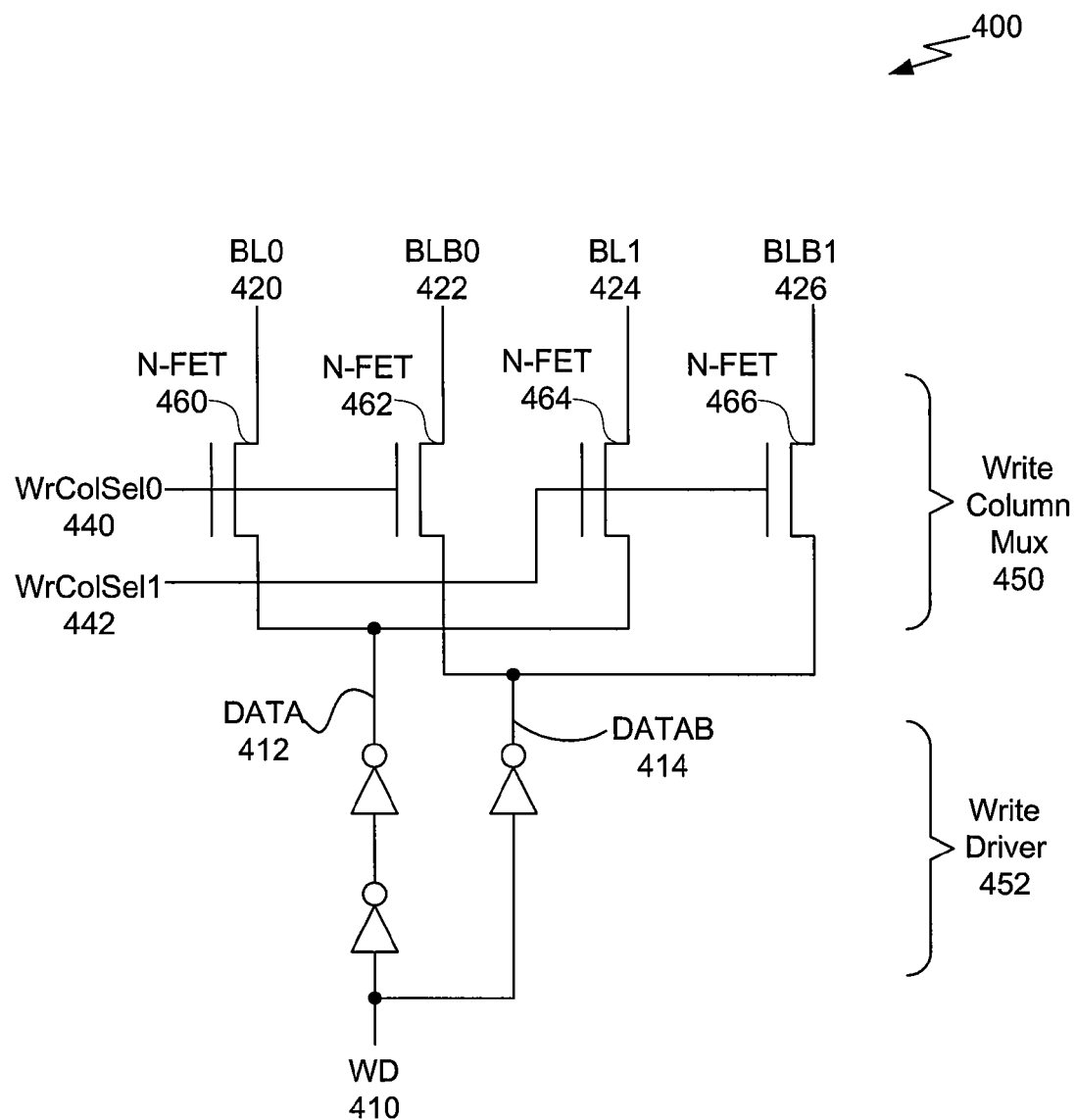
FIG. 4 illustrates the circuit design of a write path used to write data to the array of 6T SRAM cells, according to one embodiment of the invention.

FIG. 4 illustrates the circuit design of a write path 400 used to write data to the array of 6T SRAM cells 200, according to one embodiment of the invention. The write path 400 includes a write driver 452 and a write column multiplexer 450. The write column multiplexer 450 includes four N-FETs 460, 462, 464 and 466. The write path 400 receives write data (WD) 410, and two write column select controls WrColSel0 440 and WrColSel1 442.

The write driver 452 buffers WD 410 through two inverters to generate data 412 and one inverter to generated an inverted version, datab 414. The write column multiplexer 450 then routes data 412 to either BL0 420 or BL1 424 and datab 414 to either BLB0 422 or BLB1 426. When WrColSel0 440 is high (active), then N-FETs 460 and 462 are on, allowing data 412 and datab 414 to be routed to BL0 420 and BLB0 422, respectively. Similarly, when WrColSel1 442 is high (active), then N-FETs 464 and 466 are on, allowing data 412 and datab 414 to be routed to BL1 424 and BLB1 426, respectively. WrColSel0 and WrColSel1 should not be asserted high (active) simultaneously.

Figure 5:
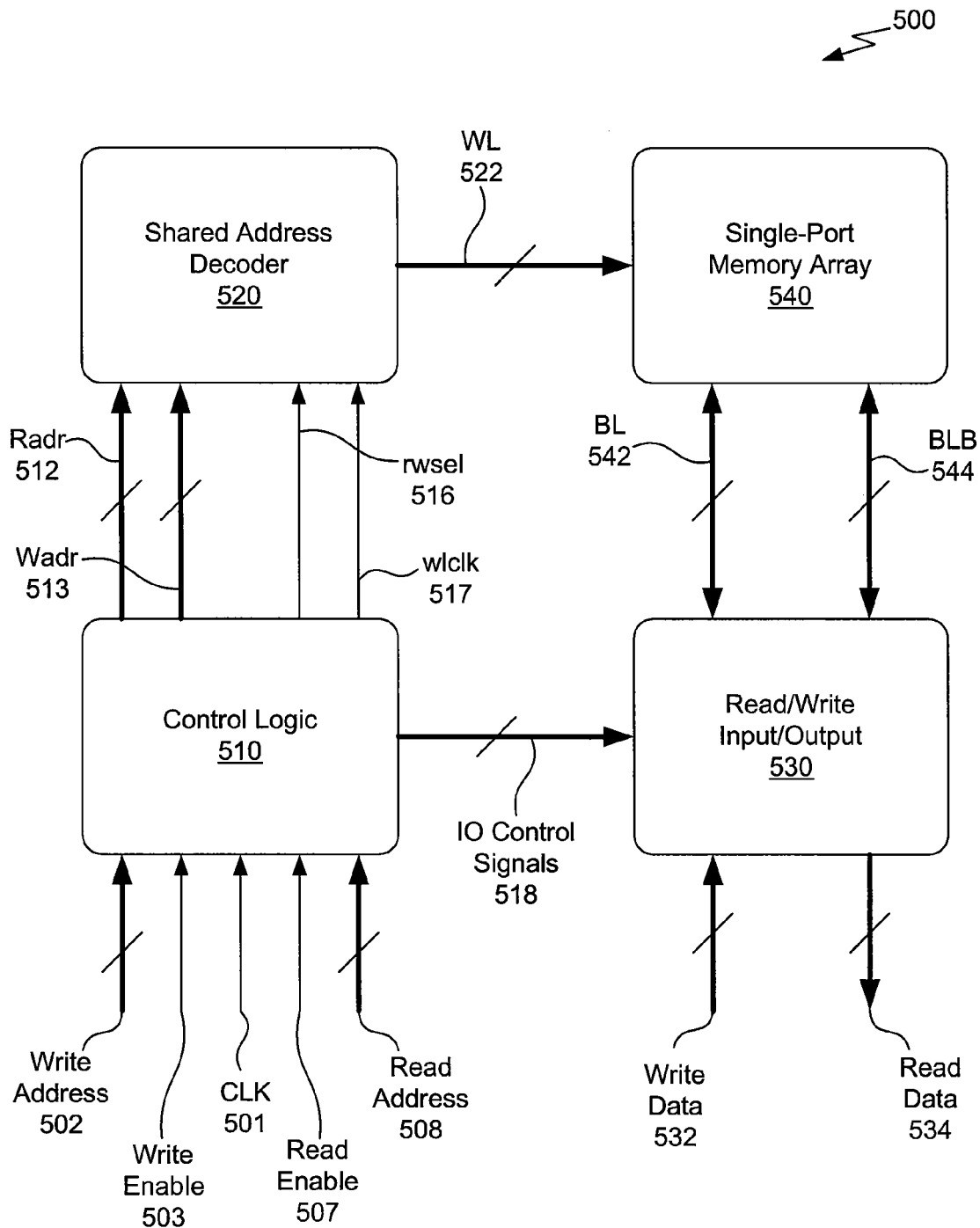
FIG. 5 depicts a two-port SRAM circuit, according to one embodiment of the invention.

FIG. 5 depicts a two-port SRAM circuit 500, according to one embodiment of the invention. The two-port SRAM circuit 500 includes control logic 510, a shared address decoder 520, a read/write input/output unit 530, and a single-port memory array 540. The two-port SRAM circuit 500 has inputs including a write address 502, a write enable 503, a clock (CLK) 501, a read enable 507, a read address 508, and write data 532. The two-port SRAM circuit 500 also includes a read data 534 output signal.

The control logic 510 may include any timing generation circuitry used to generate certain control signals used by the shared address decoder 520 and the read/write input/output unit 530. Many of these control signals may be generated by a timer unit described in the U.S. patent application titled "Generic Flexible Timer Design," filed on Aug. 13, 2007 and having the U.S. patent application Ser. No. 11/838,171. The subject matter of this related application is hereby incorporated by reference.

The shared address decoder 520 receives a read address (Radr) 512, a write address (Wadr) 513, a read-write select (rwsel) 516, and a word line clock (wlclk) 517. The shared address decoder 520 generates a set of word line (WL) select signals 522, based on either the Radr 512 or Wadr 513, addresses as selected by the rwsel 516 signal. The result of decoding the selected address is that only one of the WL 522 signals should be asserted at any one time, based on the selected address. The address selection process and the behavior of the shared address decoder 520 will be discussed in greater detail in FIGS. 7 and 8.

The single-port memory array 540 is an instance of the array of 6T SRAM cells 200 from FIG. 2 coupled to the shared address decoder 520 and the read/write input/output unit 530. The single-port memory array 540 receives word lines 522 from the shared decoder 520, and exposes bit lines BL 542 and BLB 544 to the read/write input/output unit 530.

The read/write input/output unit 530 includes one or more instances of the read path 300 from FIG. 3 and one or more instances of the write path 400 from FIG. 4. The read path 300 and write path 400 circuitry are coupled to the bit lines BL 542 and BLB 544. The read path 300 transmits resulting data to the read data 534 output of the read/write input/output unit 530. The write path 400 receives data from the write data 532 input of the read/write input/output unit 530. The read path 300 and write path 400 circuitry receive timing control from the control logic 510 through the I/O control signals 518.

Figure 6:
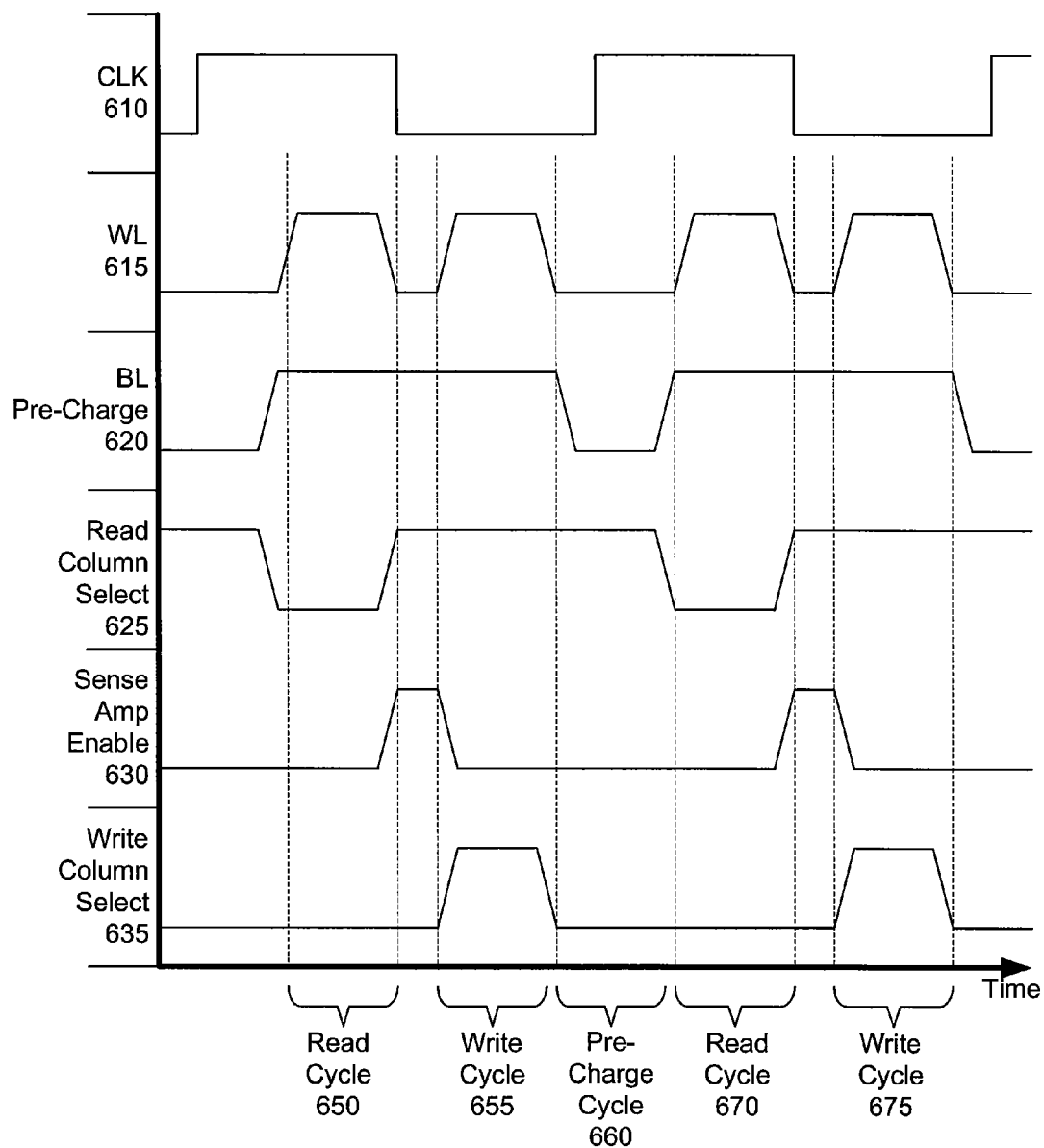
FIG. 6 illustrates timing signals used to control the operation of the two-port SRAM circuit, according to one embodiment of the invention.

FIG. 6 illustrates timing signals used to control the operation of the two-port SRAM circuit, according to one embodiment of the invention. A clock signal (CLK) 610 is used as the reference for the other signals in FIG. 6.

A word line signal (WL) 615 pulses up to two times per clock period of CLK 610. A first pulse may be used during a read cycle 650, 670 as a word line select for performing a read operation, while a second pulse may be used during a write cycle 655, 675 as a word line select for performing a write operation.

A bit line (BL) pre-charge signal 620 may be used to perform bit line pre-charges during a pre-charge cycle 660 to prepare the bit lines BL 542 and BLB 544 of FIG. 5 for a pending read operation. The bit line pre-charge signal 620 corresponds to PCHGB 310 of FIG. 3.

A read column select signal 625 illustrates the timing of the COLSEL0 312 and COLSEL1 314 signals that are used to select between sets of bit line signals for processing by the sense amplifier 354 during a read cycle 650, 670. In practice the COLSEL0 312 and COLSEL1 314 signals are individually generated, rather than generating the read column select signal 625, used here for illustrative purposes.

A sense amplifier enable 630 is used to enable the sense amplifier 354 of FIG. 3. The sense amplifier enable 630 is asserted at the very end of a read cycle 650, 670 to allow maximum charge transfer onto the bit lines prior to sensing the bit line value. The sense amplifier enable 630 corresponds to SAE 318.

A write column select signal 635 illustrates the timing of the WrColSel0 440 and WrColSel1 442 signals of FIG. 4 that are used to select between sets of bit line signals to be used for writing data during a write cycle 655, 675. In practice the WrColSel0 440 and WrColSel1 442 signals are individually generated, rather than generating the write column select signal 635, used here for illustrative purposes.

Figure 7:
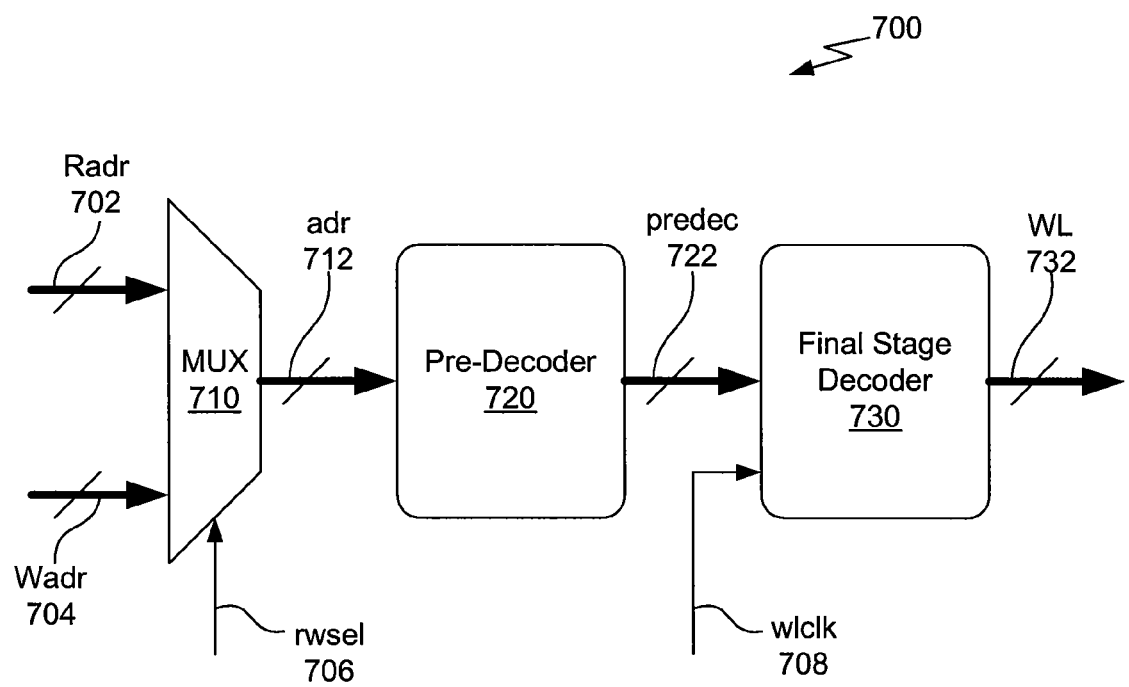
FIG. 7 depicts a word line (WL) data path used to multiplex and decode read and write addresses within the two-port SRAM circuit, according to one embodiment of the invention.

FIG. 7 depicts a word line (WL) data path 700 used to multiplex and decode read and write addresses within the two-port SRAM circuit 500, according to one embodiment of the invention.

The word line data path 700 includes an input multiplexer (MUX) 710, pre-decode logic 720 and a final stage decoder 730. The word line data path 700 receives two addresses, including a read address (Radr) 702 and a write address (Wadr) 704 that are used to generate a set of word lines (WL) 732, whereby only one word line within WL 732 is asserted at a time, according to the selected address (adr) 712. The read-write select (rwsel) 706 signal causes MUX 710 to route either Radr 702 or Wadr 704 to adr 712. For example, when rwsel is low, then Radr 702 is selected for output to adr 712, whereas when rwsel is high, then Wadr 704 is selected for output to adr 712. The pre-decoder 720 generates predec 722, a one-hot decoded representation of adr 712. The final stage decoder 730 gates predec 722 against a word line clock (wlclk) 708 to produce word lines (WL) 732. A given word line from WL 732 connects to one word line 220 within FIG. 2 for the purpose of selecting the corresponding row 222.

Figure 8:
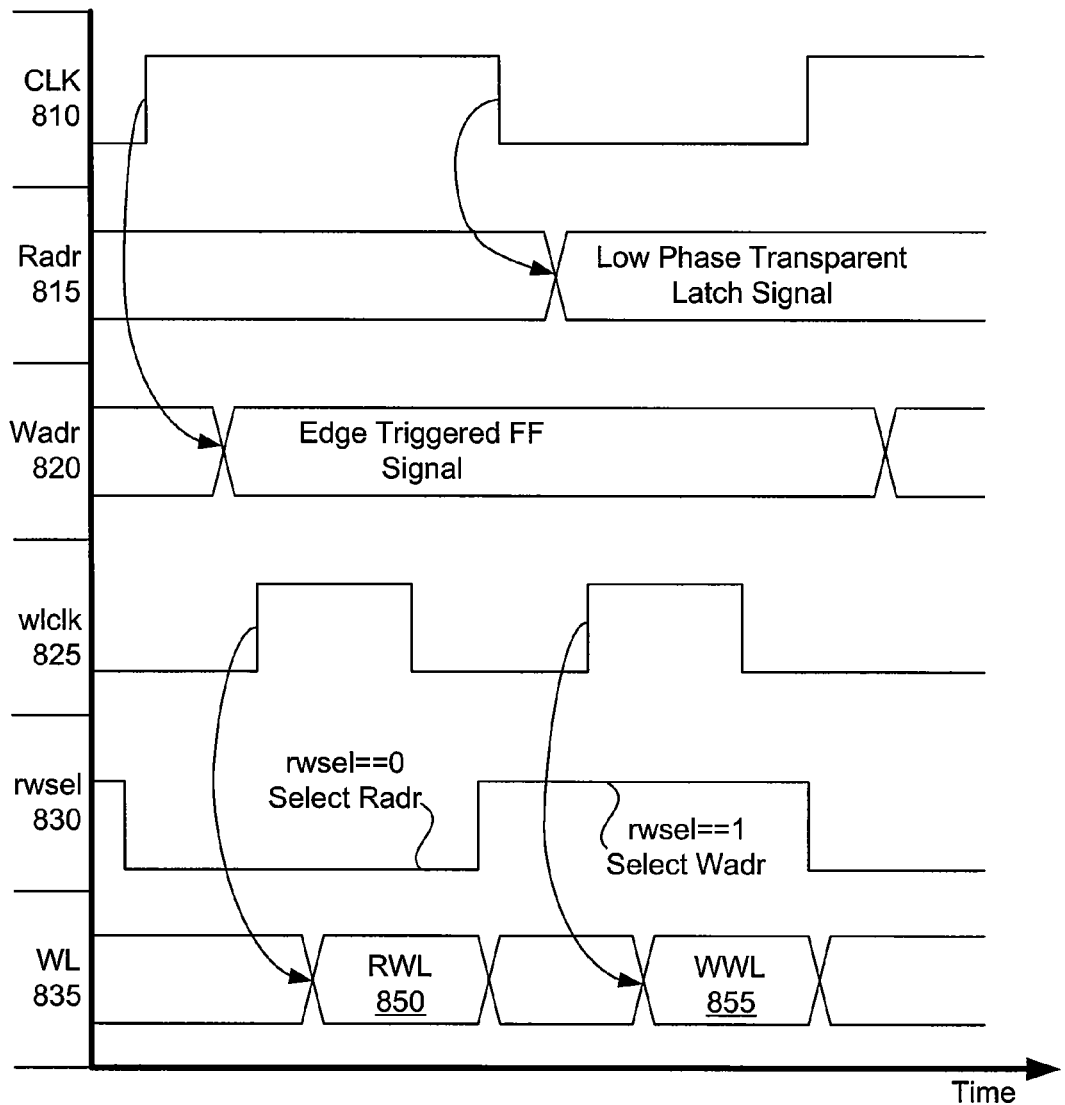
FIG. 8 illustrates timing relationships of signals within the two-port SRAM circuit, according to one embodiment of the invention.

FIG. 8 illustrates timing relationships of signals within the two-port SRAM circuit 500, according to one embodiment of the invention. A clock (CLK) 810 provides reference timing for the remaining signals.

Radr 815 is an output from a low phase transparent latch, representing a desired read address. Wadr 820 represents a desired write address that is captured on the rising edge of CLK 810.

The word line clock (wlclk) 825 signal pulses twice per period of CLK 810, thereby causing the final stage decoder 730 of FIG. 7 to generate a word line pulse on the appropriate word line at the appropriate time to first perform a read from a desired word line within the array of 6T SRAM cells 200 of FIG. 2, and then to perform a write to a desired word line.

The read-write select (rwsel) 830 signal first selects the read address (Radr) 702 during the first half of CLK 810, and then selects the write address (Wadr) 704 during the second half of CLK 810.

The word lines (WL) 835 transition relative to the wlclk 825 signal used to gate the generation of WL 835 against the predec 722 signal. A read word line (RWL) 850 pulse is therefore generated on one of the word lines 835 during a read cycle. Similarly, a write word line (WWL) 855 pulse is generated on one of the word lines 835 during a write cycle.

Figure 9:
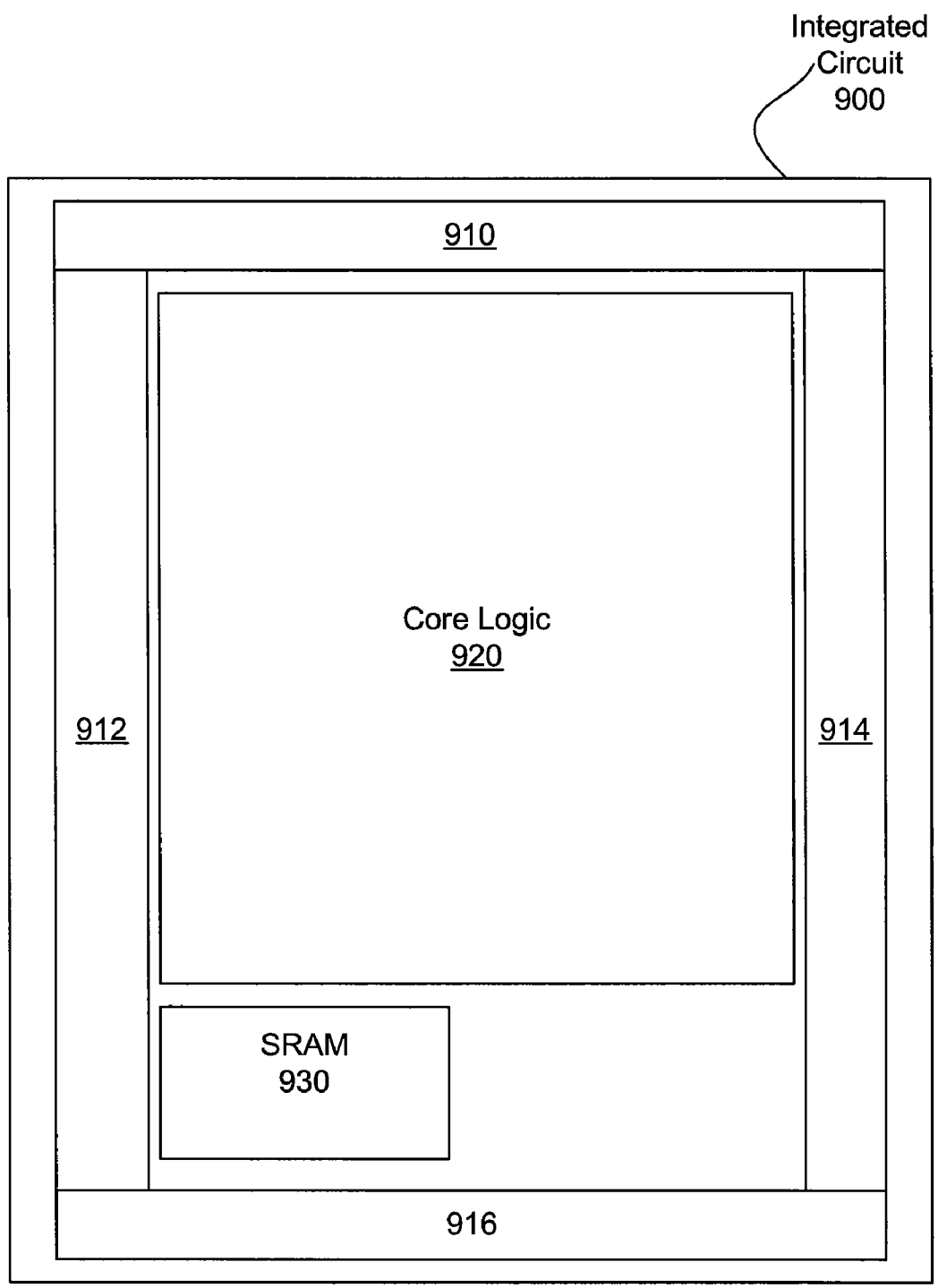
FIG. 9 depicts an integrated circuit in which one or more aspects of the invention may be implemented.

FIG. 9 depicts an integrated circuit 900 in which one or more aspects of the invention may be implemented. The integrated circuit 900 includes input/output circuits 910, 912, 914 and 916, as well as core logic 920. The integrated circuit 900 also includes at least one SRAM 930. The SRAM 930 includes one or more instances of a two-port SRAM circuit 500 from FIG. 5.

In sum, a two-port SRAM design is presented with an associated die area comparable to a one-port SRAM. To achieve area efficiency, the read and write ports are restricted to mutually synchronous operation, which represents the common usage model for many applications. By restricting both ports of the SRAM to synchronous operation, a dual-pump timing model can be introduced, whereby one pre-charge cycle may be eliminated. By eliminating one pre-charge cycle and allocating one read and one write time slot within each clock cycle, the SRAM design can provide the functionality of two access ports that operate in an edge-triggered clocking regime.

While the forgoing is directed to embodiments of the present invention, other and further embodiments of the invention may be devised without departing from the basic scope thereof. For example, aspects of the present invention may be implemented in hardware or software or in a combination of hardware and software. Therefore, the scope of the present invention is determined by the claims that follow.

We claim:

1. A two-port static random access memory (SRAM) circuit, comprising:
    control logic configured to receive a reference clock signal and to transmit a read address, a write address and a read-write select signal;
    a shared address decoder configured to receive the read address, the write address and the read-write select signal from the control logic and to multiplex the read address and the write address using the read-write select signal such that only one word line signal is asserted at a time;
    a single-port memory array configured to receive the asserted word line signal from the shared address decoder; and
    a read/write input/output unit configured to read data from and write data to the single-port memory array,
    wherein the control logic is further configured to transmit the read address and the write address and initiate a bit line pre-charge only once within a period of the reference clock signal, and the shared address decoder is further configured to assert a read word line and a write word line within a period of the reference clock signal to perform one read operation and one write operation in the period of the reference clock signal.

2. The memory circuit of claim 1, wherein the shared address decoder includes a multiplexer that routes either the read address or the write address to a selected address.

3. The memory circuit of claim 2, wherein the shared address decoder further includes a pre-decoder that generates a decoded representation of the selected address.

4. The memory circuit of claim 3, wherein the control logic transmits a word line clock signal to the shared address decoder, and the shared address decoder further includes a final stage decoder that gates the decoded representation of the selected address against the word line clock signal to produce a word line signal.

5. The memory circuit of claim 1, wherein the single-port memory array comprises an array of SRAM cells that includes a word line for each row of SRAM cells and a pair of bit lines for each column of SRAM cells, and wherein each SRAM cell includes six transistors.

6. The memory circuit of claim 1, wherein the single-port memory array exposes one or more bit lines to the read/write input/output unit in response to a word line received from the shared address decoder.

7. The memory circuit of claim 1, wherein the read/write input/output unit includes a read path and a write path.

8. The memory circuit of claim 7, wherein the read path includes a pre-charge circuit, a read column multiplexer, a sense amplifier and an output latch.

9. The memory circuit of claim 7, wherein the write path includes a write column multiplexer and a write driver.

10. An integrated circuit, comprising:
    a plurality of input/output circuits;
    core logic; and
    a static random access memory (SRAM) unit that includes a two-port SRAM circuit that comprises:
        control logic configured to receive a reference clock signal and to transmit a read address, a write address and a read-write select signal,
        a shared address decoder configured to receive the read address, the write address and the read-write select signal from the control logic and to multiplex the read address and the write address using the read-write select signal such that only one word line signal is asserted at a time,
        a single-port memory array configured to receive the asserted word line signal from the shared address decoder, and
        a read/write input/output unit configured to read data from and write data to the single-port memory array,
        wherein the control logic is further configured to transmit the read address and the write address and initiate a bit line pre-charge only once within a period of the reference clock signal, and the shared address decoder is further configured to assert a read word line and a write word line within a period of the reference clock signal to perform one read operation and one write operation in the period of the reference clock signal.

11. The integrated circuit of claim 10, wherein the shared address decoder includes a multiplexer that routes either the read address or the write address to a selected address.

12. The integrated circuit of claim 11, wherein the shared address decoder further includes a pre-decoder that generates a decoded representation of the selected address.

13. The integrated circuit of claim 12, wherein the control logic transmits a word line clock signal to the shared address decoder, and the shared address decoder further includes a final stage decoder that gates the decoded representation of the selected address against the word line clock signal to produce a word line signal.

14. The integrated circuit of claim 10, wherein the single-port memory array comprises an array of SRAM cells that includes a word line for each row of SRAM cells and a pair of bit lines for each column of SRAM cells, and wherein each SRAM cell includes six transistors.

15. The integrated circuit of claim 10, wherein the single-port memory array exposes one or more bit lines to the read/write input/output unit in response to a word line received from the shared address decoder.

16. The integrated circuit of claim 11, wherein the read/write input/output unit includes a read path and a write path.

17. The integrated circuit of claim 16, wherein the read path includes a pre-charge circuit, a read column multiplexer, a sense amplifier and an output latch.

18. The integrated circuit of claim 16, wherein the write path includes a write column multiplexer and a write driver.

19. The memory circuit of claim 1, wherein the bit line pre-charge shorts each positive sense bit line to each corresponding negative sense bit line and pulling the positive sense bit line and corresponding negative sense bit line to a positive supply voltage only prior to a read operation.

20. The integrated circuit of claim 10, wherein the bit line pre-charge shorts each positive sense bit line to each corresponding negative sense bit line and pulling the positive sense bit line and corresponding negative sense bit line to a positive supply voltage only prior to a read operation.

* * * * *